United States Patent
Jacquet et al.

(10) Patent No.: US 10,578,672 B2
(45) Date of Patent: Mar. 3, 2020

(54) METHOD, DEVICE AND ARTICLE TO TEST DIGITAL CIRCUITS

(71) Applicant: STMicroelectronics (Grenoble 2) SAS, Grenoble (FR)

(72) Inventors: David Jacquet, Vaulnaveys le Haut (FR); Didier Fuin, Lumbin (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 529 days.

(21) Appl. No.: 14/986,053

(22) Filed: Dec. 31, 2015

(65) Prior Publication Data

US 2017/0192053 A1    Jul. 6, 2017

(51) Int. Cl.
  *G01R 31/317*    (2006.01)
  *G01R 31/3177*   (2006.01)
  *G01R 31/3185*   (2006.01)

(52) U.S. Cl.
  CPC ... *G01R 31/3177* (2013.01); *G01R 31/31703* (2013.01); *G01R 31/31708* (2013.01); *G01R 31/318566* (2013.01); *G01R 31/318569* (2013.01)

(58) Field of Classification Search
  CPC .... G01R 31/318541; G01R 31/318536; G01R 31/3177; G01R 31/318569; G01R 31/318566; G01R 31/31708; G01R 31/31703; G01R 31/317
  USPC ......................................................... 714/727
  See application file for complete search history.

(56) References Cited

U.S. PATENT DOCUMENTS

| 6,023,778 | A  |   | 2/2000 | Li |
| 6,249,892 | B1 | * | 6/2001 | Rajsuman ........... G06F 11/2236 |
|           |    |   |        | 714/727 |
| 7,269,780 | B2 | * | 9/2007 | Arima .................. G06F 1/3203 |
|           |    |   |        | 713/300 |

(Continued)

FOREIGN PATENT DOCUMENTS

| CN | 1284182 A   | 2/2001 |
| CN | 101300500 A | 11/2008 |
| CN | 104881357 A | 9/2015 |

OTHER PUBLICATIONS

Extended European Search Report and European Search Opinion, dated Jun. 13, 2017, for corresponding European application No. 16162142.0, 7 pages.

*Primary Examiner* — Samir W Rizk
*Assistant Examiner* — Enam Ahmed
(74) *Attorney, Agent, or Firm* — Seed IP Law Group LLP

(57) ABSTRACT

A digital circuit includes a scan chain which loads data into and unloads data from the digital circuit. Checking circuitry is coupled to the scan chain and generates a first digital signature based on data indicative of a pre-testing status of the digital circuit as the data is unloaded from the digital circuit via the scan chain. When testing is completed, the data is restored to the digital circuit via the scan chain. The checking circuitry generates a second digital signature as the data is loaded into the digital circuit. The first digital signature is compared to the second digital signature to verify an integrity of the process. A specific data pattern may be loaded into the scan chain as the data is unloaded. An output of the scan chain may be monitored to detect the pattern and an error signal may be generated based on when the pattern is detected.

19 Claims, 2 Drawing Sheets

(56) References Cited

U.S. PATENT DOCUMENTS

| | | | | |
|---|---|---|---|---|
| 7,395,473 B2* | 7/2008 | Cheng | ............ | G01R 31/31703 714/727 |
| 7,444,568 B2* | 10/2008 | Morrison | ....... | G01R 31/318536 714/726 |
| 7,484,153 B2* | 1/2009 | Kiryu | ............ | G01R 31/318536 714/727 |
| 7,644,327 B2* | 1/2010 | Cohn | ............ | G01R 31/318519 326/10 |
| 7,644,333 B2* | 1/2010 | Hill | ................ | G01R 31/318547 714/726 |
| 7,676,728 B2* | 3/2010 | Resnick | ................ | G06F 11/106 711/105 |
| 7,945,834 B2 | 5/2011 | Waayers et al. | | |
| 8,862,955 B2* | 10/2014 | Cesari | ............ | G01R 31/318552 714/726 |
| 8,996,939 B2 | 3/2015 | Casarsa | | |
| 9,310,436 B2 | 4/2016 | Picalausa et al. | | |
| 2003/0115525 A1* | 6/2003 | Hill | ................ | G01R 31/318547 714/726 |
| 2004/0230884 A1* | 11/2004 | Rajski | ............ | G01R 31/318566 714/742 |
| 2007/0130489 A1* | 6/2007 | Kiryu | ............ | G01R 31/318536 714/733 |
| 2007/0220381 A1* | 9/2007 | Huang | ............ | G01R 31/318569 714/724 |
| 2012/0173943 A1* | 7/2012 | Cesari | ............ | G01R 31/318552 714/731 |
| 2014/0047293 A1* | 2/2014 | Lamb | ...................... | G01R 31/27 714/727 |
| 2015/0212151 A1 | 7/2015 | Picalausa et al. | | |
| 2016/0003900 A1* | 1/2016 | Narayanan | ..... | G01R 31/318555 714/726 |
| 2016/0109514 A1* | 4/2016 | Jindal | ............ | G01R 31/318572 714/727 |

\* cited by examiner

METHOD, DEVICE AND ARTICLE TO TEST DIGITAL CIRCUITS

BACKGROUND

Technical Field

The present disclosure generally relates to the field of testing integrated circuits. For example, the testing of integrated circuits used in automotive applications.

Description of the Related Art

Integrated circuits may be tested at the end of the manufacturing process to verify the correct operation of the integrated circuits. For example, scan patterns may be loaded into the flip-flops of an integrated circuit and the outputs of the integrated circuit may be verified, for example by using a scan chain of the integrated circuit and a dedicated machine external to the integrated circuit.

Integrated circuits also may be tested by a device including the integrated circuit. For example, an integrated circuit of a computer may be tested upon start-up of the computer. Scan patterns may be generated and loaded into flip-flops of the integrated circuit and the outputs of the integrated circuit may be verified, for example by using scan chains of the integrated circuit and dedicated circuitry of the integrated circuit or of the computer.

Integrated circuits may also fail during operation. For example, a unit may fail due to a hardware failure (e.g., transistor failures, open/short circuits, delay faults) due to aging, overheating, etc., a soft error (e.g., a high energy particle), etc. Thus, integrated circuits also may be tested periodically during operation.

BRIEF SUMMARY

In an embodiment, a device comprises: a digital circuit; a scan chain coupled to the digital circuit, wherein the scan chain, in operation, loads data into the digital circuit and unloads data from the digital circuit; and checking circuitry coupled to the scan chain, wherein the checking circuitry, in operation, generates a first digital signature based on data indicative of a pre-testing status of the digital circuit as the data is unloaded from the digital circuit via the scan chain; generates a second digital signature based on the data indicative of the pre-testing status of the digital circuit as the data is loaded into the digital circuit via the scan chain; compares the first digital signature to the second digital signature; and generates a control signal based on the comparison. In an embodiment, the device comprises a memory configured to store the data indicative of the pre-testing status of the digital circuit. In an embodiment, the device comprises a controller configured to control testing of the digital circuit. In an embodiment, the checking circuitry, in operation, loads a specific data pattern into the scan chain as the data indicative of the pre-test status of the digital circuit is unloaded; scans an output of the scan chain to detect the specific data pattern; and generates an error signal based on when the specific data pattern is detected. In an embodiment, the checking circuitry comprises: a first signature generating circuit connected to an output of the scan chain, which in operation generates the first digital signature; a second signature generating circuit connected to an input of the scan chain, which in operation generates the second digital signature; and a comparator coupled to the first and second signature generating circuits, which in operation generates the control signal. In an embodiment, the device comprises an integrated circuit including: the digital circuit; the scan chain; and the checking circuitry. In an embodiment, the integrated circuit includes a controller configured to control testing of the digital circuit.

In an embodiment, a system comprises: digital circuitry including: flip-flops; one or more scan chains, wherein the one or more scan chains, in operation, load data into the flip-flops and unload data from the flip-flops; and checking circuitry coupled to the one or more scan chains, wherein the checking circuitry, in operation, generates a first digital signature based on data indicative of a pre-testing status of the flip-flops as the data is unloaded from the flip-flops via the one or more scan chains; generates a second digital signature based on the data indicative of the pre-testing status of the flip-flops as the data is loaded into the digital circuit via the one or more scan chains; compares the first digital signature to the second digital signature; and generates a control signal based on the comparison; and a controller configured to control testing of the digital circuitry. In an embodiment, the system comprising a memory configured to store the data indicative of the pre-testing status of the flip-flops. In an embodiment, the checking circuitry, in operation, loads a specific data pattern into a scan chain of the one or more scan chains as the data indicative of the pre-test status of the flip-flops is unloaded; scans an output of the scan chain of the one or more scan chains to detect the specific data pattern; and generates an error signal based on when the specific data pattern is detected. In an embodiment, the checking circuitry comprises: a first signature generating circuit connected to outputs of the one or more scan chains, which in operation generates the first digital signature; a second signature generating circuit connected to inputs of the one or more scan chains, which in operation generates the second digital signature; and a comparator coupled to the first and second signature generating circuits, which in operation generates the control signal. In an embodiment, the system comprises an integrated circuit including: the digital circuitry; and the controller.

In an embodiment, a system comprises: digital circuitry; means for loading data into the digital circuitry and unloading data from the digital circuitry; means for generating a first digital signature based on data indicative of a pre-testing status of the digital circuitry as the data is unloaded from the digital circuitry by the means for loading and unloading data; means for generating a second digital signature based on data indicative of a pre-testing status of the digital circuitry as the data is loaded into the digital circuitry by the means for loading and unloading data; and means for generating a control signal based on the first and second signatures. In an embodiment, the system comprises means for storing the data indicative of the pre-testing status of the digital circuitry. In an embodiment, the system comprises: means for loading a specific data pattern into the means for loading and unloading data as the data indicative of the pre-test status of the digital circuitry is unloaded; means for detecting the specific data pattern; and means for generating an error signal based on when the specific data pattern is detected.

In an embodiment, a method comprises: unloading, using a scan chain, data indicative of a pre-test status of a digital circuit from the digital circuit; generating, using a first signature generating circuit coupled to an output of the scan chain, a first digital signature based on the data indicative of the pre-test status of the digital circuit as the data is unloaded from the digital circuit; testing the digital circuit; loading, using the scan chain, the data indicative of the pre-test status of a digital circuit into the digital circuit; generating, using a second signature generating circuit coupled to an input of the scan chain, a second digital signature based on the data indicative of the pre-test status of the digital circuit as the data is loaded into the digital circuit; comparing, using a comparator, the first digital signature and the second digital signature; and generating a control signal based on the first and second signatures. In an embodiment, the method comprises storing the data indicative of the pre-testing status of the digital circuit in a memory separate from the digital circuit. In an embodiment, the method comprises: loading a specific data pattern into the scan chain as the data indicative of the pre-test status of the digital circuitry is unloaded; scanning the output of the scan chain to detect the specific data pattern; and generating an error signal based on when the specific data pattern is detected.

DETAILED DESCRIPTION

Figure 1:
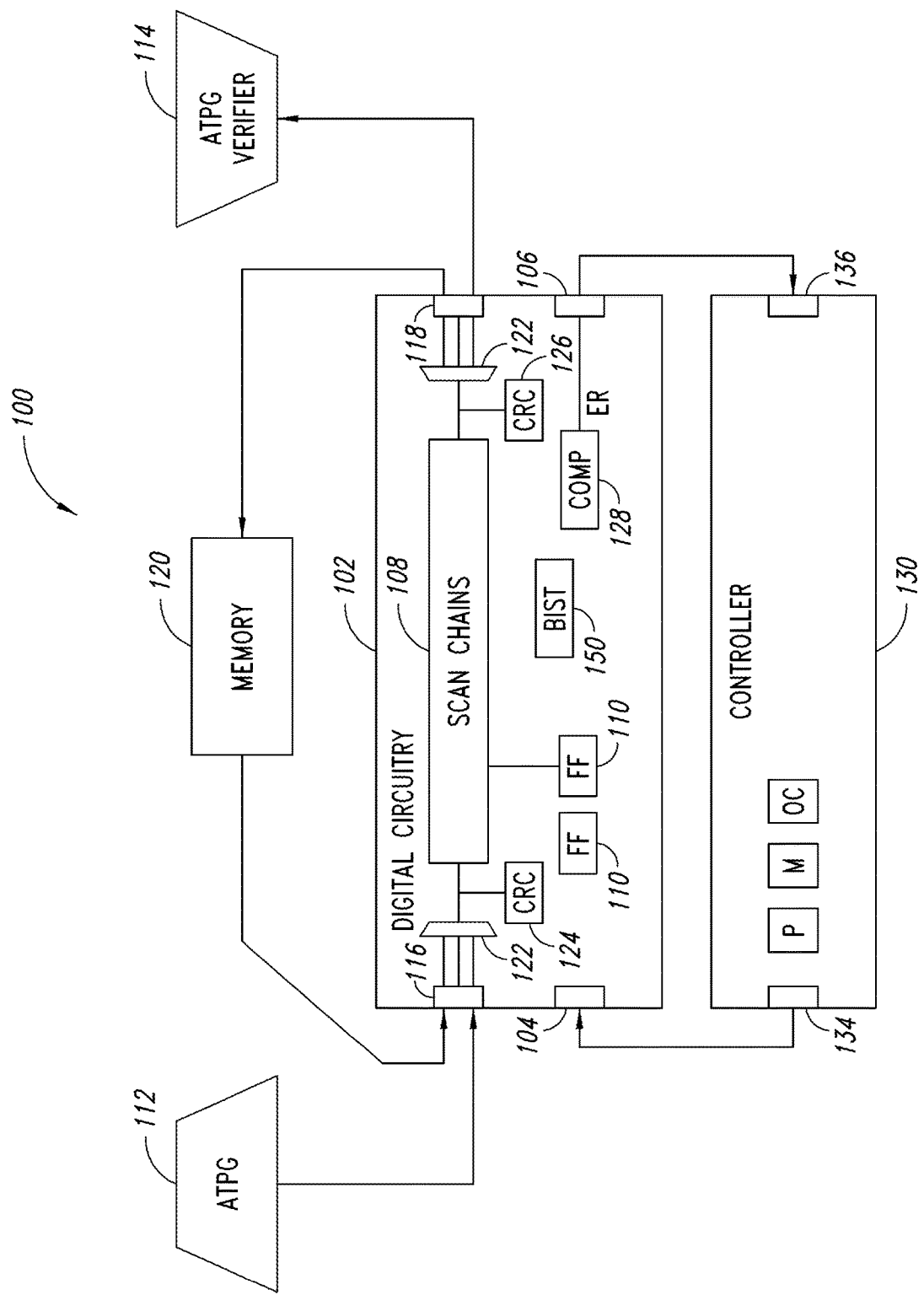
FIG. 1 is a functional block diagram of an embodiment of a system including digital circuitry.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, integrated circuits, such as transistors, adders, state machines, memory, logic gates, comparators, buses, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

Referring to FIG. 1, a system 100 comprises digital circuit or circuitry 102, such as an integrated circuit or portion thereof which in operation processes digital signals, such as one or more input digital signals received at an input interface 104, to produce one or more output signals at an output interface 106. The digital circuit 102 also comprises one or more scan chains 108 to load and unload data from components of the digital circuit 102, such as one or more flip-flops 110 of the digital circuit 102, in a known manner. The digital circuit 102 may comprise, for example, a CPU, a field programmable gate array, etc.

The system 100 comprises a controller 130, which in operation provides signals, such as power, data and control signals, to the digital circuit 102, and receives signals, such as power, data and control signals, from the digital circuit 102. For example, the controller 130 may include one or more processors P, one or more memories M and discrete circuit OC. The controller 130 may be, for example, a controller of a vehicle and the digital circuit 102 may be a digital control module which in operation controls one or more components of the vehicle (e.g., an automatic speed control module, etc.) or performs one or more functions of the automobile (e.g., maintenance alert monitoring, etc.). As illustrated, the controller 130 outputs one or more signals to the digital circuit 102 via an output interface 134, and receives one or more input signals from the digital circuit 102 via input interface 136.

The system 100 comprises an automatic test pattern generator (ATPG) 112, which as illustrated is of a decompression type, and an ATPG verifier 114, which as illustrated is of a compression type. The digital circuit 102 has an interface 116 to receive test patterns from the ATPG 112 and an interface 118 to output test results to the ATPG 114. In a known manner, the digital circuit 102 may be tested by loading test patterns from the ATPG 112 into the digital circuit 102 (e.g., into the flip-flops) and outputting test results to the ATPG verifier 114 via the scan chains 108. The digital circuitry also comprises built-in-self-test circuitry (BIST) 150. In a known manner, the digital circuit 102 may be tested by the BIST 150. For example, the digital circuit 102 may be tested by loading test patterns from the BIST 150 into the digital circuit 102 (e.g., into the flip-flops) and outputting test results to the BIST 150 via the scan chains 108. The system 100 also comprises a memory 120, which may be a random access memory. The digital circuit 102 comprises one or more multiplexers 122 to facilitate loading and unloading of data from the scan chains 108. For example, a multiplexer 122 may be used to select whether to load data from the memory 120 or from the ATPG 112 into a scan chain 108 and a multiplexer 122 may be used select whether to output data from a scan chain 108 to the memory or to the ATPG verifier 114. The digital circuitry 102 may operate in two modes of operation, an operational mode and a testing mode. In a known manner, data indicative of the status of the digital circuitry 102 (e.g., data indicative of the status of the flip-flops) may be stored into the memory 120 just before switching from the operational mode to the testing mode of operation, and the status of the digital circuitry may restored when switching from the test mode of operation to the operational mode of operation based on the data indicative of the status of the digital circuit 102 which is stored in the memory 120. See, for example, U.S. Pat. No. 8,996,939 issued to Casarsa. This may facilitate compliance with safety standards which may require testing of an integrated circuit during operation (e.g., periodically, such as every 100 ms), while avoiding destruction of the status of the integrated circuit during the testing. For example, a vehicle (e.g., a car, a motorcycle, an airplane, a rocket, etc.) may be tested periodically while the vehicle is in operation.

The data indicative of the status of the digital circuit 102, however, may become corrupted during a testing cycle. For example, a soft error (e.g., a high energy particle may corrupt the operation of the system 100 (flip-flop data corruption, memory cell corruption, etc.) without creating hardware failures), a hardware error or failure (e.g., transistor failures, open/short, delay faults), etc., could occur in the save/restore path, in the scan chains during the load/unload process (e.g., a hold error), or inside the memory 120.

The digital circuit 102 comprises one or more first checking blocks CRC 124 each coupled to an input of one or more of the scan chains 108, and one or more second checking blocks CRC 126 each coupled to an output of one or more of the scan chains 108. As described below with reference to FIG. 2, when the digital circuit 102 enters the test mode of operation and data indicative of the status of the digital circuit 102 is output via a scan chain 108 for storage in the memory 120, one of the second checking blocks 126 generates an output signature based on the data output by the scan chain. For example, the checking block 126 may perform a cyclic redundancy check or a checksum on the full length and width of the data during a saving process. When the test is completed and the digital circuit 102 loads the data indicative of the status of the digital circuitry 102 from the memory 120 into the scan chain 108, one of the first checking blocks 124 generates an input signature based on the data loaded into the scan chain 108 from the memory 120. For example, the checking block 124 may perform a cyclic redundancy check or a checksum on the full length and width of the data during the restore process. A comparator 128 compares the input signature from the first checking block 124 and the output signature from the second checking block 126 and generates a control signal ER based on the comparison (e.g., if the input signature and the output signature do not match, an error signal is generated). The control signal ER may be provided to the controller 130, which may take one or more actions based on the control signal, such as resetting the digital circuit 102, initiating one or more actions of a safety protocol, etc. Coupling the first and second checking blocks at the input and output respectively of the scan chains facilitates checking for errors introduced anywhere in the store/restore process. For example, errors introduced outside the memory in the data path may be detected. The first checking block 124, the second checking block 126 and the comparator 128 may include circuitry, such as buffers, flip-flops, etc., to generate, store and compare output and input signatures generated during the test process. For example, circuitry to store an output signature generated during saving process to compare to an input signature generated during the corresponding restoring process. The circuitry of the first and second checking blocks 124, 126 and the comparator 128 may include scan chains, checking blocks, and comparators so that the first and second checking blocks 124, 126 and the comparator 128 may be tested, for example in a manner similar to the testing of the digital circuit 102 described herein.

Some embodiments may employ additional tests, such as performing scans to search for specific sets of data during a scan out process to check for hold violations (e.g., due to aging of transistors, wires, etc., timing errors, etc.) between the flip-flops of the scan chain during the scan out process, to check for stuck at errors in the scan chain, etc. For example, the first checking block 124 may be configured to load a specific data pattern into the scan chain as the status of the digital circuitry is being output through the scan chain (e.g., a pattern that is unlikely to occur during normal operation, such as a series of zeros or ones having a length that is unlikely to occur during normal operation of the digital circuit 102, such as a length equal to a length of the scan chain, etc.). The second checking block 126 or the comparator 128 may be configured to verify that the data indicative of status of the digital circuitry is followed by the expected specific data pattern at the expected time. If the specific pattern is detected too early, a hold error has occurred and an error signal may be generated. A series of patterns may be used in some embodiments to check for flip-flops in the scan chain that are stuck at a specific value (e.g., a series of ones followed by a series of zeros or vice-versa, etc.).

While the embodiment of FIG. 1 illustrates the various functional blocks of the system 100 as separate blocks, the functional blocks may be split or combined in various manners. For example, all or part of the memory 120, the ATPG 112, the ATPG verifier 114 and/or the controller 130 may be incorporated into the digital circuit 102, the comparator 128 and the first checking block 124 may be combined, etc. The system 100 may comprise an integrated circuit including one or more of the digital circuit 102, the memory 120, the ATPG 112, the ATPG verifier 114 and the controller 130. For ease of illustration, a simple transport mechanism has been shown. Some embodiments may employ more complicated transport mechanisms, such as synchronization bridges, etc.

Embodiments of the system 100 may include additional components, may not include all of the illustrated components, etc., and various combinations thereof. For example, some embodiments of the system 100 may comprise a display to display error messages, some embodiments may employ additional scan chains, checking blocks and comparators (e.g., such as in the controller 130), etc., and various combinations thereof.

Figure 2:
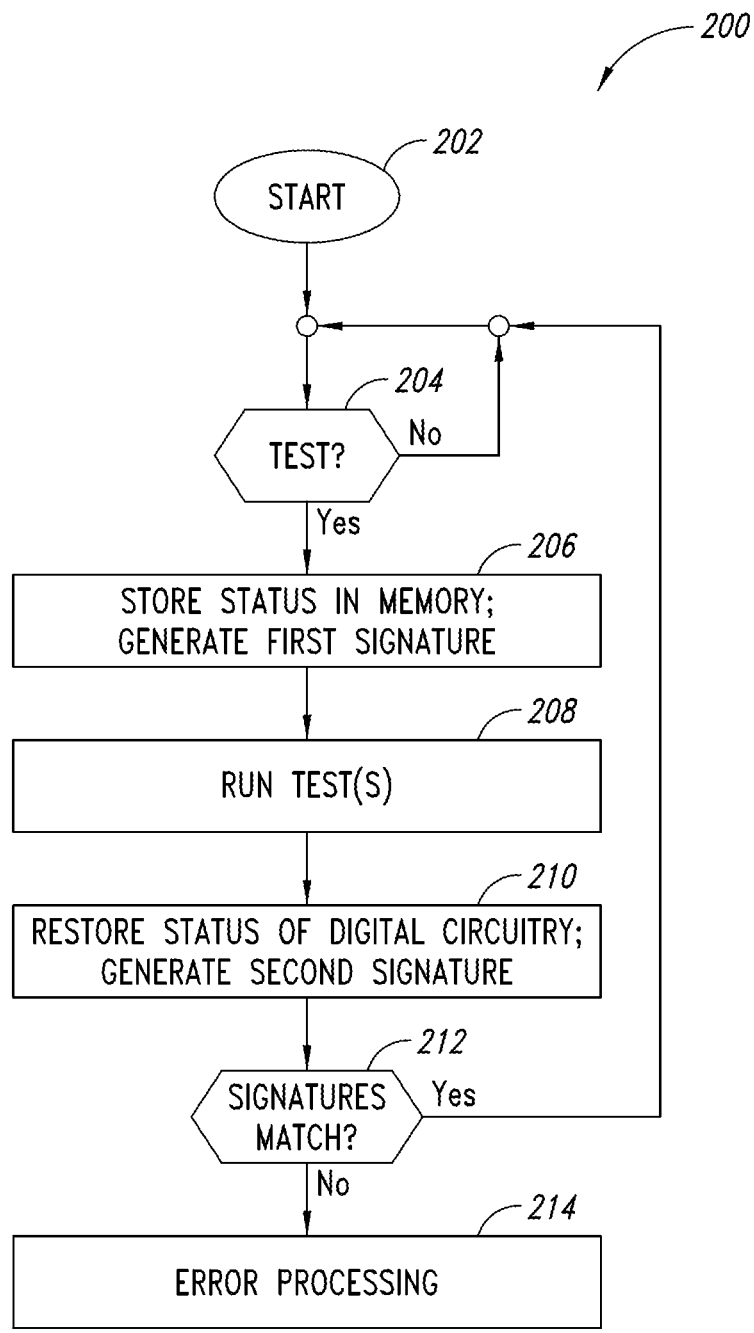
FIG. 2 illustrates an embodiment of a method of testing digital circuitry.

FIG. 2 illustrates an embodiment of a method 200 of testing digital circuitry, such as an integrated circuit, which will be described for convenience with reference to the system 100 of FIG. 1. The method starts at act 202 and proceeds to act 204. At act 204, the system 100 determines whether to enter a test mode of operation of the digital circuit 102. For example, the system 100 may periodically run a test of the digital circuit 102, and may determine to enter the test mode of operation based on a timer or counter.

When it is determined to enter the test mode of operation, the method 200 proceeds from act 204 to act 206. Otherwise, the method 200 returns to act 204. At act 206, the system 100 unloads the status of the digital circuit 102 via the scan chain 108 for storage into the memory 120, and at the same time generates a first signature based on the status of the digital circuit 102 as it is unloaded from the scan chain 108. For example, the status of the digital circuitry 102 may be stored by outputting data indicative of the status (e.g., data indicative of the status of flip-flops 110) via the scan chains 108 for storage in the memory 120, while at the same time a first signature is generated in the digital circuit 102 by second checking circuitry CRC 126 based on the data as it is unloaded. The method 200 proceeds from act 206 to act 208.

At act 208, the method 200 executes testing of the digital circuit 102. For example, in a known manner scan patterns may be loaded into the digital circuitry 102 and corresponding results output using the scan chains 108, and the results may then be analyzed, for example by the ATPG verifier 114, the BIST 150 and/or the controller 130. The execution of the testing may be controlled, for example, by the ATPG 112, the BIST 150, and/or the controller 130.

The method 200 proceeds from act 208 to act 210. At act 210, the system 100 restores the status of the digital circuit 102 by retrieving the data stored in the memory 120 and loading the data into the digital circuit via the scan chain 108. The first checking block 124 generates a second signature based on the data as it is loaded into the scan chain 108. The method 200 proceeds from act 210 to act 212.

At act 212, the system 100 determines whether the first and second signatures match. For example, a comparator 128 may compare the first and second signatures. When it is determined at act 212 that the first and second signatures match, the method 200 proceeds from act 212 to act 204. When it is determined at act 212 that the signatures do not match, the method 200 proceeds from act 212 to act 214, where error processing occurs, such as, for example, generating a control signal indicating an error has been detected during the restore process.

Embodiments of methods of testing digital circuitry may contain additional acts not shown in FIG. 2, may not contain all of the acts shown in FIG. 2, may perform acts shown in FIG. 2 in various orders, and may be modified in various respects. For example, specific scan patterns may be loaded into the scan chain after act 210 to check for hold or stuck at errors in the scan chain.

Some embodiments may take the form of or comprise computer program products. For example, according to one embodiment there is provided a computer readable medium comprising a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof. For example, checking of the data as it is loaded/unloaded from the scan chains may be implemented in hardware, and responding to an indication of an error may be implemented using software.

The various embodiments described above can be combined to provide further embodiments. Aspects of the embodiments can be modified, if necessary to employ concepts of the various patents, applications and publications to provide yet further embodiments.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a digital circuit;
a scan chain coupled to the digital circuit, wherein the scan chain, in operation, loads data into the digital circuit and unloads data from the digital circuit; and
checking circuitry coupled to the scan chain, wherein the checking circuitry, in operation,
generates a first digital signature based on data indicative of a pre-testing status of the digital circuit as the data is unloaded from the digital circuit via the scan chain;
generates, after generation of the first digital signature, a second digital signature based on the data indicative of the pre-testing status of the digital circuit as the data is loaded into the digital circuit via the scan chain;
compares the first digital signature to the second digital signature;
generates a control signal based on the comparison;
loads a specific data pattern into the scan chain as the data indicative of the pre-test status of the digital circuit is unloaded;
scans an output of the scan chain to detect the specific data pattern; and
generates an error signal based on when the specific data pattern is detected.

2. The device of claim 1, comprising:
a memory configured to store the data indicative of the pre-testing status of the digital circuit.

3. The device of claim 1, comprising:
a controller configured to control testing of the digital circuit.

4. The device of claim 1 wherein the checking circuitry comprises:
a first signature generating circuit connected to an output of the scan chain, which in operation generates the first digital signature;
a second signature generating circuit connected to an input of the scan chain, which in operation generates the second digital signature; and
a comparator coupled to the first and second signature generating circuits, which in operation generates the control signal.

5. The device of claim 1, comprising an integrated circuit including:
the digital circuit;
the scan chain; and
the checking circuitry.

6. The device of claim 5 wherein the integrated circuit includes a controller configured to control testing of the digital circuit.

7. A system, comprising:
digital circuitry including:
flip-flops;
one or more scan chains, wherein the one or more scan chains, in operation, load data into the flip-flops and unload data from the flip-flops; and
checking circuitry coupled to the one or more scan chains, wherein the checking circuitry, in operation,
generates a first digital signature based on data indicative of a pre-testing status of the flip-flops as the data is unloaded from the flip-flops via the one or more scan chains;
generates, after generation of the first digital signature, a second digital signature based on the data indicative of the pre-testing status of the flip-flops as the data is loaded into the digital circuit via the one or more scan chains;
compares the first digital signature to the second digital signature; and
generates a control signal based on the comparison; and a controller configured to control testing of the digital circuitry, wherein the checking circuitry, in operation,
  loads a specific data pattern into a scan chain of the one or more scan chains as the data indicative of the pre-test status of the flip-flops is unloaded;
  scans an output of the scan chain of the one or more scan chains to detect the specific data pattern; and
  generates an error signal based on when the specific data pattern is detected.

8. The system of claim 7, comprising:
a memory configured to store the data indicative of the pre-testing status of the flip-flops.

9. The system of claim 7 wherein the checking circuitry comprises:
  a first signature generating circuit connected to outputs of the one or more scan chains, which in operation generates the first digital signature;
  a second signature generating circuit connected to inputs of the one or more scan chains, which in operation generates the second digital signature; and
  a comparator coupled to the first and second signature generating circuits, which in operation generates the control signal.

10. The system of claim 7, comprising an integrated circuit including:
  the digital circuitry; and
  the controller.

11. A system, comprising:
  digital circuitry;
  means for loading data into the digital circuitry and unloading data from the digital circuitry;
  means for generating a first digital signature based on data indicative of a pre-testing status of the digital circuitry as the data is unloaded from the digital circuitry by the means for loading and unloading data;
  means for generating, after generation of the first digital signature, a second digital signature based on data indicative of a pre-testing status of the digital circuitry as the data is loaded into the digital circuitry by the means for loading and unloading data;
  means for loading a specific data pattern into the means for loading and unloading data as the data indicative of the pre-test status of the digital circuitry is unloaded;
  means for detecting the specific data pattern;
  means for generating an error signal based on when the specific data pattern is detected; and
  means for generating a control signal based on the first and second signatures.

12. The system of claim 11, comprising:
  means for storing the data indicative of the pre-testing status of the digital circuitry.

13. A method, comprising:
  unloading, using a scan chain, data indicative of a pre-test status of a digital circuit from the digital circuit;
  generating, using a first signature generating circuit coupled to an output of the scan chain, a first digital signature based on the data indicative of the pre-test status of the digital circuit as the data is unloaded from the digital circuit;
  loading a specific data pattern into the scan chain as the data indicative of the pre-test status of the digital circuitry is unloaded;
  scanning the output of the scan chain to detect the specific data pattern;
  generating an error signal based on when the specific data pattern is detected;
  testing the digital circuit;
  loading, using the scan chain, the data indicative of the pre-test status of a digital circuit into the digital circuit;
  generating, after generation of the first digital signature and using a second signature generating circuit coupled to an input of the scan chain, a second digital signature based on the data indicative of the pre-test status of the digital circuit as the data is loaded into the digital circuit;
  comparing, using a comparator, the first digital signature and the second digital signature; and
  generating a control signal based on the first and second signatures.

14. The method of claim 13, comprising storing the data indicative of the pre-testing status of the digital circuit in a memory separate from the digital circuit.

15. The method of claim 13 wherein the control signal is indicative of detection of an error condition and the method comprises initiating error processing when the control signal indicates the error condition has been detected.

16. The device of claim 1 wherein the control signal is indicative of detection of an error condition and at least one of the digital circuit and the checking circuitry initiates error processing when the control signal indicates the error condition has been detected.

17. The device of claim 3 wherein the control signal is indicative of detection of an error condition and the controller initiates error processing when the control signal indicates the error condition has been detected.

18. The system of claim 7 wherein the control signal is indicative of detection of an error condition and at least one of the digital circuitry and the controller initiates error processing when the control signal indicates the error condition has been detected.

19. The system of claim 11 wherein the control signal is indicative of detection of an error condition and the digital circuitry initiates error processing when the control signal indicates the error condition has been detected.

* * * * *